US012765343B2

(12) United States Patent
Chen et al.

(10) Patent No.: US 12,765,343 B2
(45) Date of Patent: Oct. 13, 2026

(54) SELF-ALIGNED NANOMETER THROUGH-SILICON-VIA STRUCTURE AND METHOD OF PREPARING THE SAME

(71) Applicant: Institute of Microelectronics, Chinese Academy of Sciences, Beijing (CN)

(72) Inventors: Xianyu Chen, Beijing (CN); Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 386 days.

(21) Appl. No.: 18/618,706

(22) Filed: Mar. 27, 2024

(65) Prior Publication Data

US 2025/0006556 A1 Jan. 2, 2025

(30) Foreign Application Priority Data

Jun. 30, 2023 (CN) ......................... 202310798552.0

(51) Int. Cl.
*H10W 20/00* (2026.01)

(52) U.S. Cl.
CPC ....... *H10W 20/069* (2026.01); *H10W 20/023* (2026.01)

(58) Field of Classification Search
None
See application file for complete search history.

(56) References Cited

U.S. PATENT DOCUMENTS

| | | | | |
|---|---|---|---|---|
| 2019/0019676 | A1 * | 1/2019 | Zhang | H10D 30/024 |
| 2023/0326831 | A1 * | 10/2023 | Na | H10D 30/014 |
| 2023/0343839 | A1 * | 10/2023 | Kim | H10D 64/01 |

* cited by examiner

*Primary Examiner* — Hung K Vu
(74) *Attorney, Agent, or Firm* — Schwegman Lundberg & Woessner, P.A.

(57) ABSTRACT

Provided are a self-aligned nanometer through-silicon-via structure and a method of preparing the same. According to the preset range and positions of the first and second trenches, the second preset pattern is formed, and then the first initial blind hole is formed by etching based on the second preset pattern, so that the position of the nanometer through-silicon-via is determined. The depth of the buried power rail may be determined by etching the silicon substrate with the first preset depth, and the depth of the self-aligned nanometer through-silicon-via may be determined by etching the silicon substrate with the second preset depth or thinning the fourth structure from a side of the silicon substrate.

10 Claims, 16 Drawing Sheets

SELF-ALIGNED NANOMETER THROUGH-SILICON-VIA STRUCTURE AND METHOD OF PREPARING THE SAME

CROSS REFERENCE

This application claims priority to Chinese Patent Application No. 202310798552.0, filed on Jun. 30, 2023, the whole disclosure of which is incorporated herein by reference in its entirety.

TECHNICAL FIELD

The present disclosure relates to the field of semiconductors, and in particular, to a self-aligned nanometer through-silicon-via structure and a method of preparing the same.

BACKGROUND

With the scaling-down process of basic units—Metal-Oxide-Semiconductor Field-Effect Transistor (MOSFET) devices and Fin Field-Effect Transistors (FinFET)—of integrated circuits, Backside Power Delivery Network (BSPDN) technology that may reduce the unit area cost will be widely applied in future technology nodes. However, the current application of Backside Power Delivery Network technology is limited by a high interface contact resistance between Buried Power Rail (BPR) and Nanometer Through-Silicon-Via (N-TSV), and the potential lithography alignment problem between buried power rail and nanometer through-silicon-via limits the further miniaturization of MOSFET devices.

SUMMARY

In view of this, the present disclosure provides a Self-Aligned Nanometer Through-Silicon-Via (SANTSV) structure and a method of preparing the same for at least partially solving the above-mentioned problems.

According to a first aspect of the present disclosure, a method of preparing a self-aligned nanometer through-silicon-via structure, including: step S1, providing a silicon substrate, the silicon substrate includes a fin structure perpendicular to a surface of the silicon substrate and extending upwardly, growing a first SiO2 layer on the silicon substrate, the first SiO2 layer covers the fin and is located at a same height as the fin, so that a first structure is obtained; step S2, growing a sacrificial layer on a top surface of the first structure, forming a first preset pattern on a top surface of the sacrificial layer, sequentially etching the sacrificial layer, the first SiO2 layer, and the silicon substrate with a first preset depth downwardly from the top surface of the sacrificial layer according to the first preset pattern so as to form an initial trench parallel to the fin, the initial trench includes a first trench, a second trench, and a third trench arranged in sequence; step S3, filling a first filler in the initial trench until the first filler is flush with the top surface of the sacrificial layer, the first filler includes SiO2; step S4, forming a second preset pattern on a top surface of the first filler, the second preset pattern is located at positions of the first trench and the second trench, sequentially etching the first filler and the silicon substrate with a second preset depth downwardly from the top surface of the first filler according to the second preset pattern so as to form a first initial blind hole; step S5, filling a second filler in the first initial blind hole until the second filler is flush with the top surface of the sacrificial layer. Remove the sacrificial layer, and the first and second filler located within a height range of the sacrificial layer sequentially so as to obtain a second structure, the second filler includes SiO2; step S6, growing a second SiO2 layer on a top surface of the second structure, etching the second SiO2 layer corresponding to a position of the remaining first filler and the second SiO2 layer corresponding to a position of the remaining second filler, etching the remaining first filler to form a target trench, and etching the remaining second filler to form a first target blind hole; step S7, filling a third filler in the target trench and the first target blind hole, the third filler is higher than a root of the fin and lower than a top of the fin, filling a fourth filler on a top surface of the third filler until the fourth filler is flush with the second SiO2 layer so as to obtain a third structure, the third filler includes tungsten and the fourth filler includes SiO2; step S8, forming a third preset pattern on a top surface of the third structure, etching the second SiO2 layer, the fourth filler, and the first SiO2 layer downwardly from the top surface of the third structure according to the third preset pattern until the third filler is exposed, filling a fifth filler in a trench generated by etching until the fifth filler is flush with the second SiO2 layer, so that a fourth structure is obtained, the fifth filler includes tungsten, and the third preset pattern does not include a position corresponding to the first target blind hole; and step S9, thinning the fourth structure from a side of the silicon substrate until the third filler in the first target blind hole is exposed, so that a self-aligned nanometer through-silicon-via structure is obtained. An anisotropic etching selective ratio of a material used in the sacrificial layer to the silicon substrate, the first SiO2 layer, the first filler, and the second filler are less than or equal to a preset ratio, and the preset ratio is 1:10. Before filling the third filler in the target trench and the first target blind hole in step S7, the method further includes: sequentially growing an electrical isolation layer, a diffusion barrier layer, and an adhesive layer at a bottom and a side wall of the target trench and the first target blind hole.

According to a second aspect of the present disclosure, based on the SANTSV structure prepared through step S9, a method of preparing another SANTSV structure is provided, including: step S10, etching the third filler in the first target blind hole exposed in step S9 so as to form a second target blind hole, the second target blind hole does not exceed a plane where the root of the fin is located; and step S11, filling a sixth filler in the second target blind hole to obtain another self-aligned nanometer through-silicon-via structure, the sixth filler includes copper.

According to a second aspect of the present disclosure, based on the SANTSV structure prepared through step S10, a method of preparing yet another SANTSV structure is provided, including: step S11', etching the silicon substrate and the third filler at a periphery of the second target blind hole so as to obtain a third target blind hole, a size of the third target blind hole gradually increases from a side of the second SiO2 layer to a thinned side; and step S12', filling a seventh filler in the third target blind hole to obtain yet another self-align nanometer through-silicon-via structure, the seventh filler includes copper or tungsten.

According to embodiments of the present disclosure, the first structure is obtained by: performing a fin field-effect transistor process until an inter fin isolation oxide filling step of the fin field-effect transistor process is completed, so that the first structure is obtained.

According to embodiments of the present disclosure, the step S2 includes: coating a photoresist on an upper surface of the sacrificial layer, forming the first preset pattern through exposure, the first preset pattern is parallel to a direction of the fin and is not located above the fin; and sequentially etching the sacrificial layer, the first SiO2 layer, and the silicon substrate downwardly from the top surface of the sacrificial layer according to the first preset pattern, and removing the remaining photoresist so as to obtain the initial trench. The operation of removing the remaining photoresist is performed after the operation of etching the sacrificial layer, or performed after sequentially etching the sacrificial layer, the first SiO2 layer, and the silicon substrate downwardly from the top surface of the sacrificial layer.

According to embodiments of the present disclosure, in step S4, the operation of "forming a second preset pattern on a top surface of the first filler, the second preset pattern is located at positions of the first trench and the second trench, sequentially etching the first filler and the silicon substrate with a second preset depth downwardly from the top surface of the first filler according to the second preset pattern so as to form a first initial blind hole" includes: coating a photoresist on the top surface of the first filler and the top surface of the sacrificial layer; exposing the photoresist within a preset range in a direction perpendicular to the fin, and determining a position corresponding to the exposed first filler as the second preset pattern; and sequentially etching the first filler and the silicon substrate with the second preset depth downwardly from the top surface of the first filler according to the second preset pattern, and removing the remaining photoresist so as to form the first initial blind hole. The operation of removing the remaining photoresist is performed after the operation of etching the first filler, or performed after sequentially etching the first filler and the silicon substrate with the second preset depth downwardly from the top surface of the first filler.

According to embodiments of the present disclosure, the step S6 further includes: after forming the target trench, continuously etching the silicon substrate with a third preset depth downwardly, and/or after forming the first target blind hole, continuously etching the silicon substrate with a fourth preset depth downwardly.

According to embodiments of the present disclosure, before etching the silicon substrate at the periphery of the second target blind hole in step S11', the method further includes: sequentially removing the adhesive layer, the diffusion barrier layer, and the electrical isolation layer on a side wall of the second target blind hole.

According to embodiments of the present disclosure, before filling the seventh filler in the third target blind hole in step S12', the method further includes: sequentially growing an electrical isolation layer, a diffusion barrier layer, and an adhesive layer on a side wall of the third target blind hole.

According to a fourth aspect of the present disclosure, a self-aligned nanometer through-silicon-via structure is provided, the self-aligned nanometer through-silicon-via structure is prepared by the method described above.

According to a fifth aspect of the present disclosure, an electronic apparatus is provided, including the self-aligned nanometer through-silicon-via structure described above.

Compared with the prior art, the self-aligned nanometer through-silicon-via structure and the method of preparing the same provided in the present disclosure have at least the following beneficial effects:

The method is compatible with mainstream FinFET processes, which may reduce preparation costs. The depth of the buried power rail may be determined by etching the silicon substrate with the first preset depth, and the depth of the self-aligned nanometer through-silicon-via may be determined by etching the silicon substrate with the second preset depth or thinning the fourth structure from a side of the silicon substrate, which may effectively control the depth of the buried power rail and the self-aligned nanometer through-silicon-via. According to the preset range and positions of the first and second trenches, the second preset pattern is formed, and then the first initial blind hole is formed by etching based on the second preset pattern, so that the position of the nanometer through-silicon-via is determined, the potential lithography alignment problem between the buried power rail and the nanometer through-silicon-via is avoided, which is conducive to further miniaturization of finned field-effect transistor device. By expanding the size of the nanometer through-silicon-via, the interface contact resistance between the buried power rail and the nanometer through-silicon-via is reduced. By replacing the filler tungsten in the expanded hole with copper that is consistent with the backside metal, the interface contact resistance is further reduced, which is conducive to the widespread application of backside power delivery network technology.

REFERENCE NUMERALS

Figure 1:
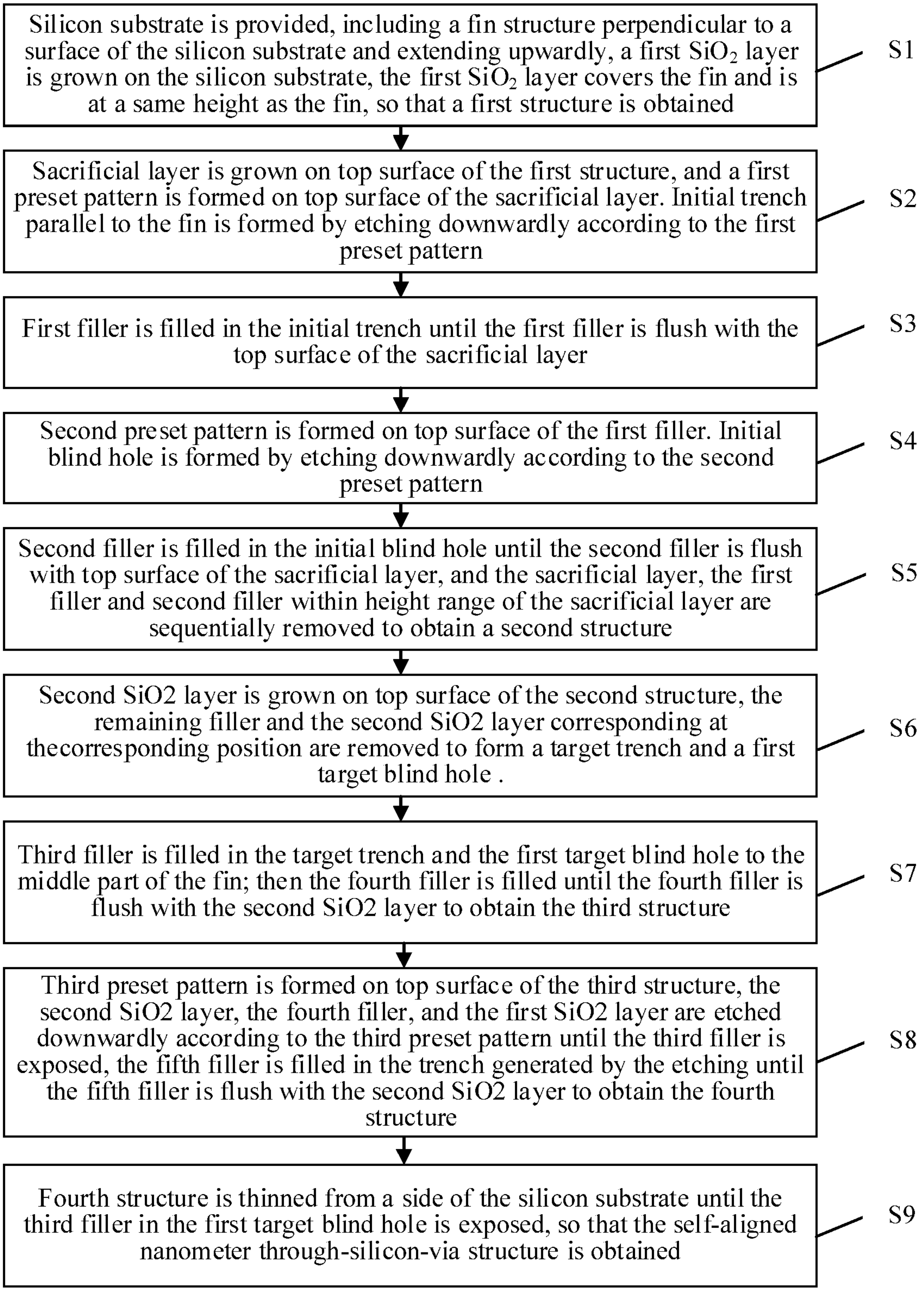
FIG. 1 shows a flowchart of a method of preparing a self-aligned nanometer through-silicon-via structure according to embodiments of the present disclosure.

1—Silicon substrate; 11—Fin; 2—First $SiO_2$ layer; 3—Sacrificial layer; 4—Initial trench; 4'—Target trench; 41—First trench; 42—Second trench; 43—Third trench; 44—First filler; 45—Second filler; 46—Third filler; 47—Fourth filler; 48—Fifth filler; 49—Sixth filler; 40—Seventh filler; 5—First initial blind hole; 51—First target blind hole; 52—Second target blind hole; 53—Third target blind hole; 6—Second $SiO_2$ layer.

DETAILED DESCRIPTION OF EMBODIMENTS

In order to make objectives, technical solutions and advantages of the present disclosure more apparent and understandable, the present disclosure will be further described in detail below in combination with specific embodiments and with reference to the accompanying drawings. Those skilled in the art should understand that various embodiments of the present disclosure listed in the following descriptions are only intended to make objectives, technical solutions and advantages of the present disclosure more apparent and understandable, they are schematic and are not intended to limit the content and scope of protection of the present disclosure. In the various embodiments listed below, the same or similar elements or components are represented by the same reference numerals. In addition, in the following descriptions, descriptions of well-known structures and technologies are omitted to avoid unnecessarily obscuring the concept of the present disclosure.

It should be noted that in the present disclosure, when a component is described as "including", "having", or "including" a component, it means that the component may include one or more elements, and that the component may also include other elements. It does not mean that the component only has one of the elements, unless otherwise specified.

In addition, in the present disclosure, ordinal numbers such as "first" or "second" are merely used to distinguish a plurality of elements with a same name, and do not imply that there are essentially steps, ranks, execution orders, or manufacturing orders between the elements unless otherwise specified. Serial numbers of the elements in the description may differ from those in the claims. For example, a "second" element in the description may be a "first" element in the claims.

In the present disclosure, unless otherwise specified, feature A "or" or "and/or" feature B means an existence of only feature A, only feature B, or both feature A and feature B. Feature A "and" feature B mean the existence of both feature A and feature B.

In addition, in present disclosure, terms such as "top", "upper", "bottom", "front", "rear", or "middle", as well as terms such as "above", "over", "on", "below", "under", or "between", are used to describe relative positions between a plurality of elements. These directional terms are based on orientations shown in the drawings. The described relative positions may be construed as including their translation, rotation, or reflection.

In addition, the terms described in the descriptions and the claims, such as "above", "over", "on", "below", or "under", are intended to enable an element to not only directly contact other elements, but also indirectly contact another element.

In addition, the term recited in the descriptions and the claims, such as "connection", means that an element may not only be directly connected to other elements, but may also be indirectly connected to other components. On the other hand, the terms "electrical connection" and "coupling" recited in the descriptions and the claims refer to an element that may not only be directly electrically connected to other elements, but also indirectly electrically connected to other elements. The present disclosure does not limit the connection manner between various elements.

In addition, in the accompanying drawings, dimensions of each component are only schematic, and these drawings are not drawn to scale, in which certain details are exaggerated and some details may be omitted for clarity of presentation. The shapes of various regions, layers and their relative sizes, positional relationships are shown in the drawings as examples only, and there may be deviations due to manufacturing tolerances or technical limitations in practice, and those skilled in the art may additionally design regions/layers with different shapes, sizes, relative positions according to actual needs. The fact that two elements have similar dimensions in the drawings does not mean that the two elements have similar dimensions in actual products, and parameters such as fit clearance and surface quality for assembling elements are not shown in the drawings.

In the present disclosure, unless otherwise specified, terms (including technical and scientific terms) used herein have the meaning commonly understood by those skilled in the art. It should be noted that, unless otherwise specified in the embodiments of the present disclosure, these terms (e.g., terms defined in a general dictionary) should have the same meaning as understood by those skilled in the art, the background of the present disclosure, or the context of the present specification, and should not be construed in an idealized or overly rigid manner.

The present disclosure may be presented in various forms, some examples of which will be described below. In the following descriptions, a selection of various materials is involved. In the selection of materials, in addition to a function of the material (for example, a semiconductor material may be used to form an active region, and a dielectric material may be used to form an electrical isolation), etching selectivity of the material is also considered. In the following descriptions, the required etching selectivity may or may not be indicated. It should be clear to those skilled in the art that when a material layer is etched as mentioned below, if it is not mentioned or shown that other layers are also etched, then the etching may be selective, and the material layer may have etching selectivity relative to other layers exposed to a same etching recipe.

Embodiments of the present disclosure provide a method of preparing a self-aligned nanometer through-silicon-via structure. FIG. 1 shows a flowchart of a method of preparing a self-aligned nanometer through-silicon-via structure according to embodiments of the present disclosure. As shown in FIG. 1, the method includes step S1 to step S9.

In step S1, a silicon substrate 1 is provided; the silicon substrate 1 includes a fin 11 structure perpendicular to a surface of the silicon substrate 1 and extending upwardly, a first $SiO_2$ layer 2 is grown on the silicon substrate 1; the first $SiO_2$ layer 2 covers the fin 11 and is at a same height as the fin 11, and a first structure is obtained.

In some embodiments of the present disclosure, the above-mentioned first structure described above is prepared using a standard Fin Field-Effect Transistor (FinFET) process. Specifically, the FinFET process is performed until an "inter fin isolation oxide filling" step of the FinFET process is completed, the FinFET process is suspended, and the first structure is obtained.

Figure 2:
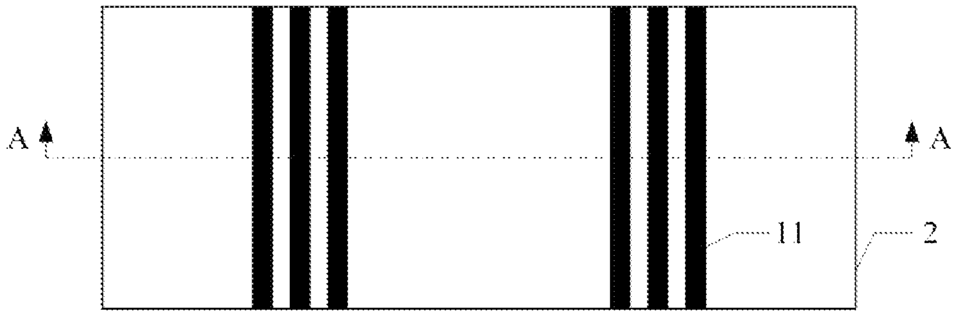
FIG. 2 shows a top view of a first structure according to embodiments of the present disclosure.
Figure 3:
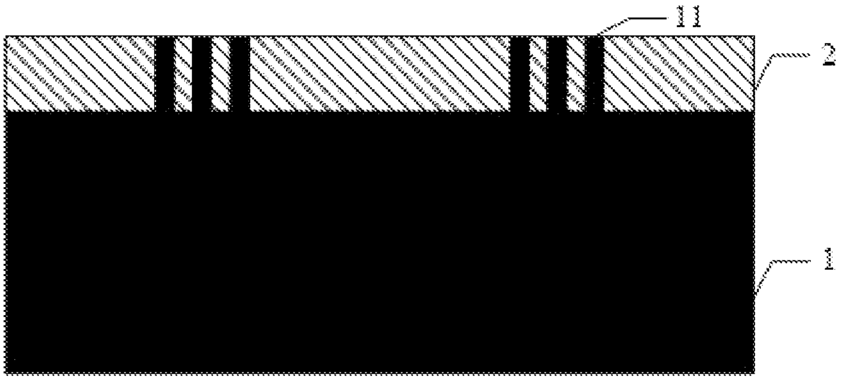
FIG. 3 shows a cross-sectional view of a first structure taken along line A-A in FIG. 2.

FIG. 2 shows a top view of a first structure according to embodiments of the present disclosure. FIG. 3 shows a cross-sectional view of a first structure taken along line A-A in FIG. 2. In embodiments shown in FIG. 2 and FIG. 3, two groups of fins 11 are extended on an upper surface of the silicon substrate 1 of the first structure, each group includes three fins 11, and a first $SiO_2$ layer 2 covering the fin 11 and at the same height as the fin 11 is grown at a periphery of each fin 11.

In step S2, a sacrificial layer 3 is grown on a top surface of the first structure, and a first preset pattern is formed on a top surface of the sacrificial layer 3. According to the first preset pattern, the sacrificial layer 3, the first $SiO_2$ layer 2, and the silicon substrate 1 with a first preset depth are sequentially etched downwardly from the top surface of the sacrificial layer 3 so as to form an initial trench 4 parallel to the fin 11. The initial trench 4 includes a first trench 41, a second trench 42, and a third trench 43 arranged in sequence.

Figure 4:
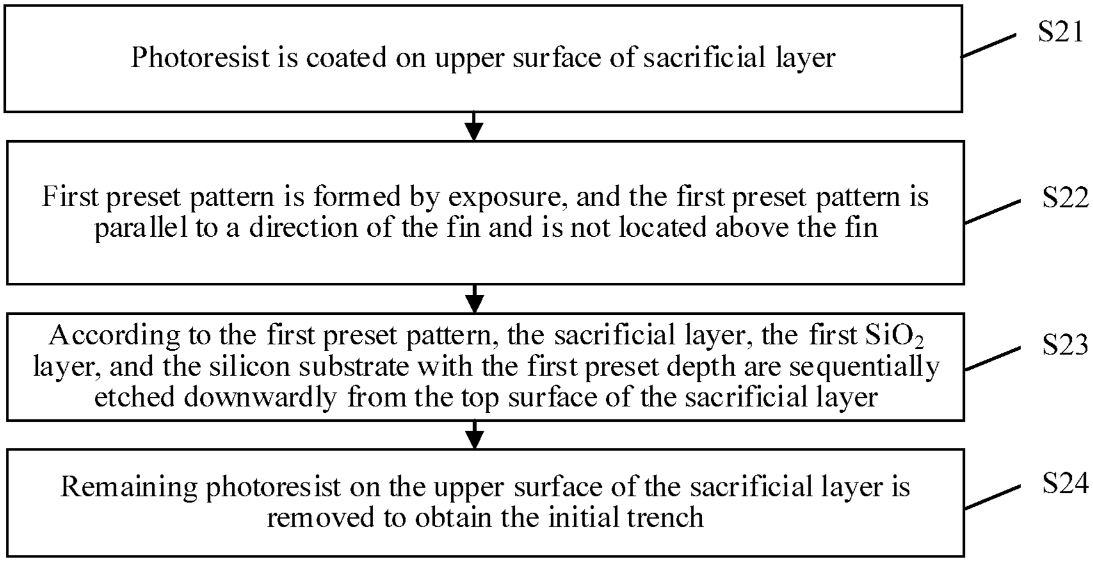
FIG. 4 shows a flowchart of forming an initial trench in a first structure according to embodiments of the present disclosure.

FIG. 4 shows a flowchart of forming an initial trench in a first structure according to embodiments of the present disclosure. As shown in FIG. 4, in some embodiments of the present disclosure, the above step S2 specifically includes the following steps.

In step S21, a photoresist is coated on an upper surface of the sacrificial layer 3.

In step S22, the first preset pattern is formed by exposure, and the first preset pattern is parallel to a direction of the fin 11 and is not located above the fin 11.

In step S23, according to the first preset pattern, the sacrificial layer 3, the first $SiO_2$ layer 2, and the silicon substrate 1 with the first preset depth are sequentially etched downwardly from the top surface of the sacrificial layer 3.

In step S24, the remaining photoresist on the upper surface of the sacrificial layer 3 is removed to obtain the initial trench 4.

In some embodiments of the present disclosure, in the step S23 described above, the photoresist is used as a barrier layer and an anisotropic reactive ion etching (RIE) method is used to complete the etching operation. According to embodiments of the present disclosure, the operation of "removing the remaining photoresist" may be carried out after the operation of "etching the sacrificial layer 3", or after sequentially etching the sacrificial layer 3, the first $SiO_2$ layer 2, and the silicon substrate 1 downwardly from the top surface of the sacrificial layer 3. In an embodiment of the present disclosure, in the step S23 described above, after the sacrificial layer 3 is etched, the remaining photoresist on the upper surface of sacrificial layer 3 is removed, and the first $SiO_2$ layer 2 and the silicon substrate 1 with the first preset depth are continuously etched downwardly. Based on this, a buried power rail with a better morphology may be obtained. It should be understood that the anisotropic reactive ion etching method used in the above-mentioned operations for etching is only a schematic example. For example, high-density plasma etching and other methods may also be used for etching. The present disclosure does not limit the specific etching method.

Figure 5:
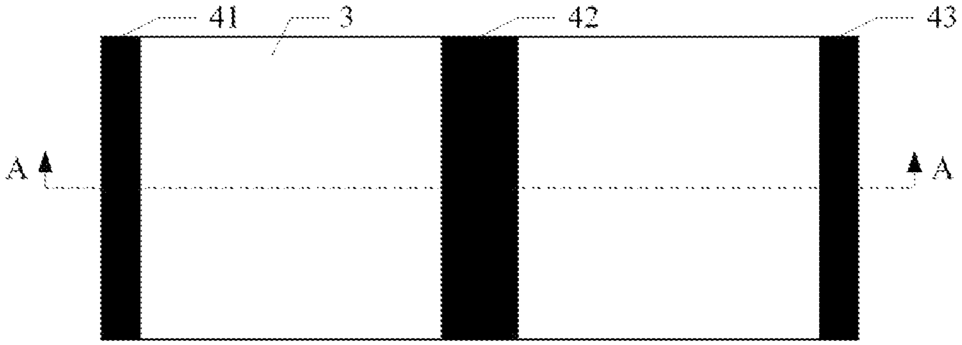
FIG. 5 shows a top view after forming the initial trench in a first structure according to embodiments of the present disclosure.
Figure 6:
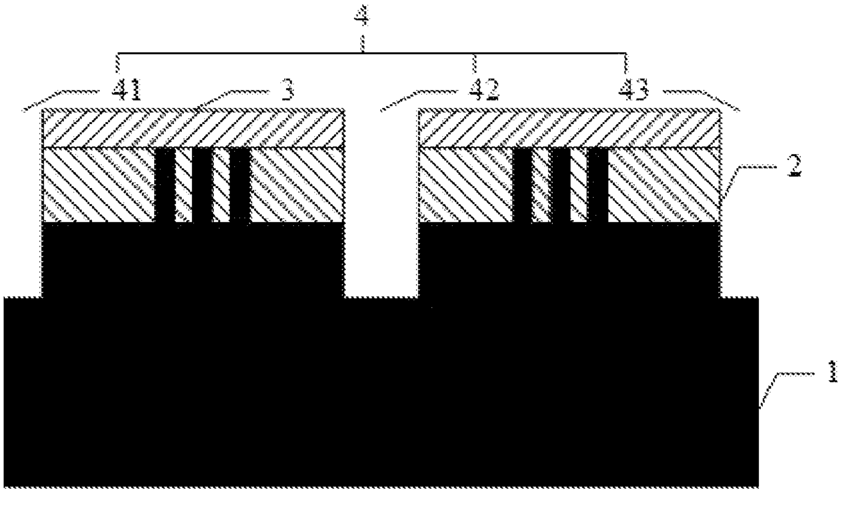
FIG. 6 shows a cross-sectional view taken along line A-A in FIG. 5 after forming the initial trench in the first structure.

FIG. 5 shows a top view after forming the initial trench in the first structure according to embodiments of the present disclosure. FIG. 6 shows a cross-sectional view taken along line A-A in FIG. 5 after forming the initial trench in the first structure. As shown in the drawing, the initial trench 4 formed after etching includes a first trench 41, a second trench 42, and a third trench 43 arranged sequentially from left to right. The first trench 41 is located on a leftmost side of the structure, the second trench 42 is located in a middle part of the structure and between two groups of fins 11, and the third trench 43 is located on a rightmost side of the structure. A position of the formed trench in the drawing is also a position of the first preset pattern before etching. By adjusting the first preset depth, a depth of the initial trench 4 is changed, thereby a final depth of the buried power rail may be adjusted, which may effectively control the depth of the buried power rail.

In step S3, the first filler 44 is filled in the initial trench 4 until the first filler 44 is flush with the top surface of the sacrificial layer 3, and the first filler 44 includes $SiO_2$.

Figure 7:
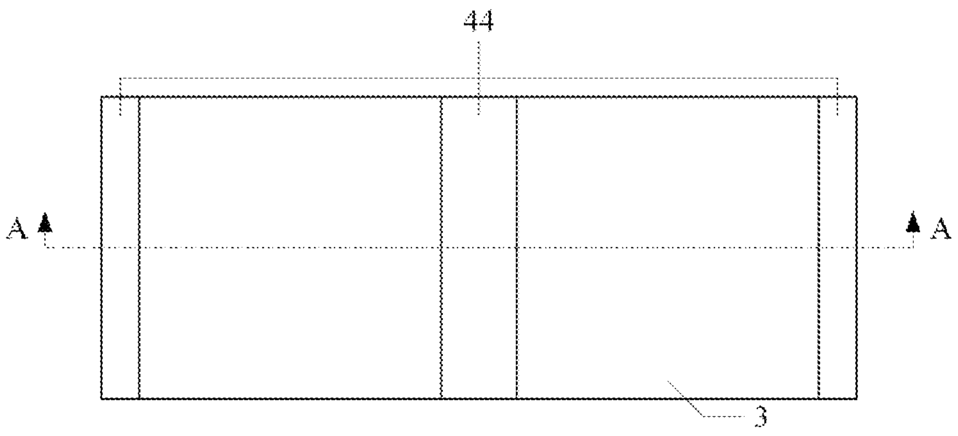
FIG. 7 shows a top view after filling a first filler in an initial trench according to embodiments of the present disclosure.
Figure 8:
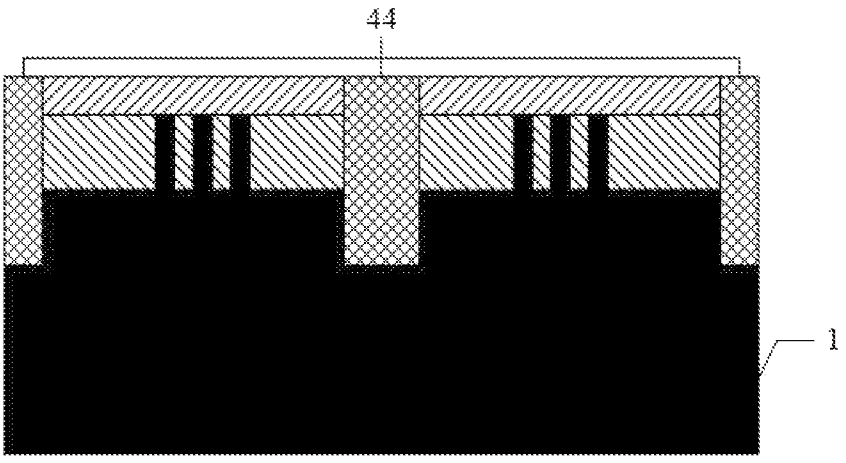
FIG. 8 shows a cross-sectional view taken along line A-A in FIG. 7 after filling a first filler in an initial trench.

FIG. 7 shows a top view after filling the first filler in the initial trench according to embodiments of the present disclosure. FIG. 8 shows a cross-sectional view taken along line A-A in FIG. 7 after filling the first filler in the initial trench. In some embodiments of the present disclosure, "the first filler 44 is filled until the first filler 44 is flush with the top surface of the sacrificial layer 3" includes: after the filling is completed, planarization is performed by using the sacrificial layer 3 as a stop layer by means of Chemical Mechanical Polish (CMP), so that the first filler 44 is flush with the top surface of the sacrificial layer 3. It should be understood that planarization through CMP in the above-mentioned operation is only a schematic example and is not intended to limit the present disclosure.

In step S4, a second preset pattern is formed on a top surface of the first filler 44, and the second preset pattern is located at positions of the first trench 41 and the second trench 42. According to the second preset pattern, the first filler 44 and the silicon substrate 1 with a second preset depth are sequentially etched downwardly from the top surface of the first filler 44 so as to form a first initial blind hole 5.

Figure 9:
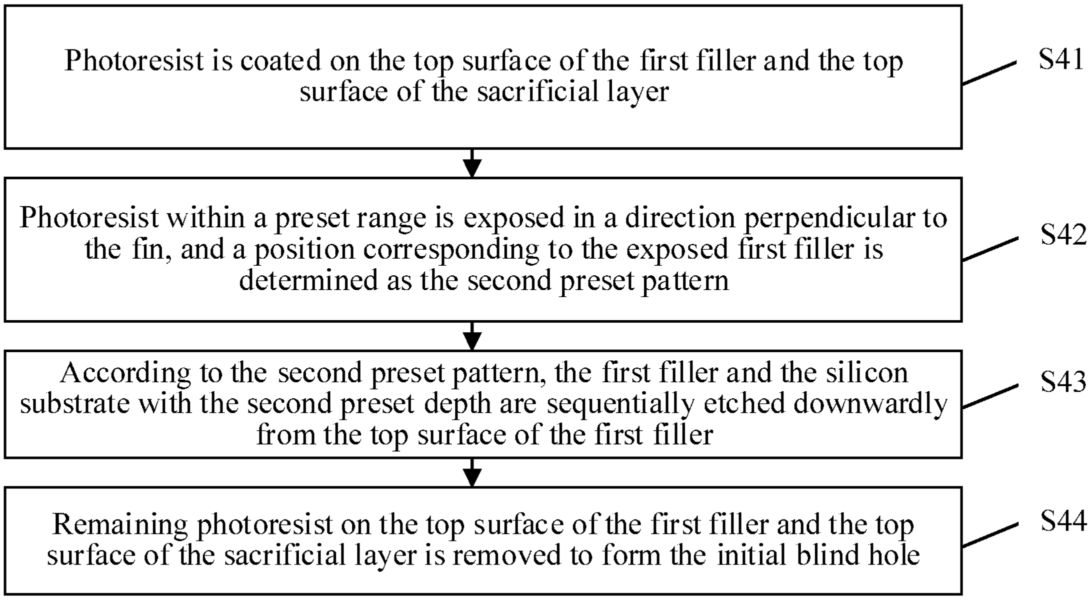
FIG. 9 shows a flowchart of etching a first filler and a silicon substrate to form a first initial blind hole according to embodiments of the present disclosure.

FIG. 9 shows a flowchart of etching the first filler and the silicon substrate to form the first initial blind hole according to embodiments of the present disclosure. As shown in FIG. 9, in some embodiments of the present disclosure, the above-mentioned step S4 includes the following steps.

In step S41, a photoresist is coated on the top surface of the first filler 44 and the top surface of the sacrificial layer 3.

In step S42, the photoresist within a preset range is exposed in a direction perpendicular to the fin 11, and a position corresponding to the exposed first filler 44 is determined as the second preset pattern.

In step S43, according to the second preset pattern, the first filler 44 and the silicon substrate 1 with the second preset depth are sequentially etched downwardly from the top surface of the first filler 44.

In step S44, the remaining photoresist on the top surface of the first filler 44 and the top surface of the sacrificial layer 3 is removed to form the first initial blind hole 5.

According to embodiments of the present disclosure, the operation of "removing the remaining photoresist" is carried out after etching the first filler 44, or after sequentially etching the first filler 44 and the silicon substrate 1 with the second preset depth downwardly from the top surface of the first filler 44. In some embodiments of the present disclosure, by removing the remaining photoresist after the operation of "etching the first filler 44", and then continuing to etch the silicon substrate 1 with the second preset depth downwardly, the first initial blind hole 5 with a better morphology may be obtained.

Figure 10:
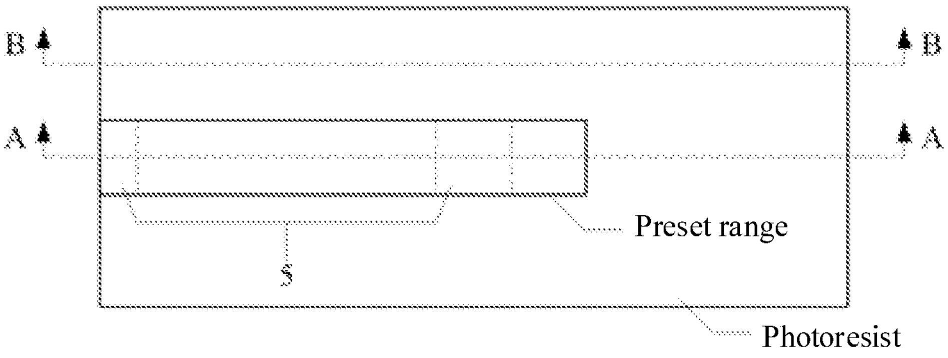
FIG. 10 shows a top view after etching a first filler and a silicon substrate according to embodiments of the present disclosure.
Figure 11:
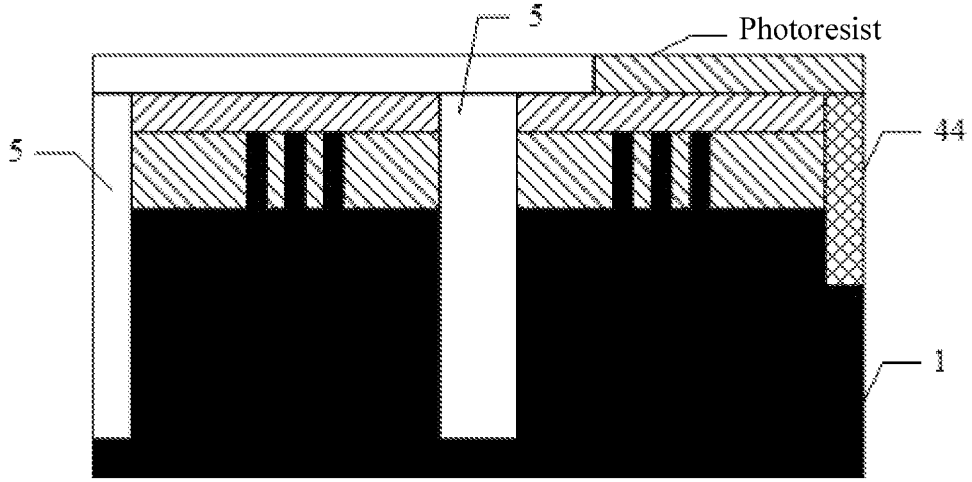
FIG. 11 shows a cross-sectional view taken along line A-A in FIG. 10 after etching a first filler and a silicon substrate.
Figure 12:
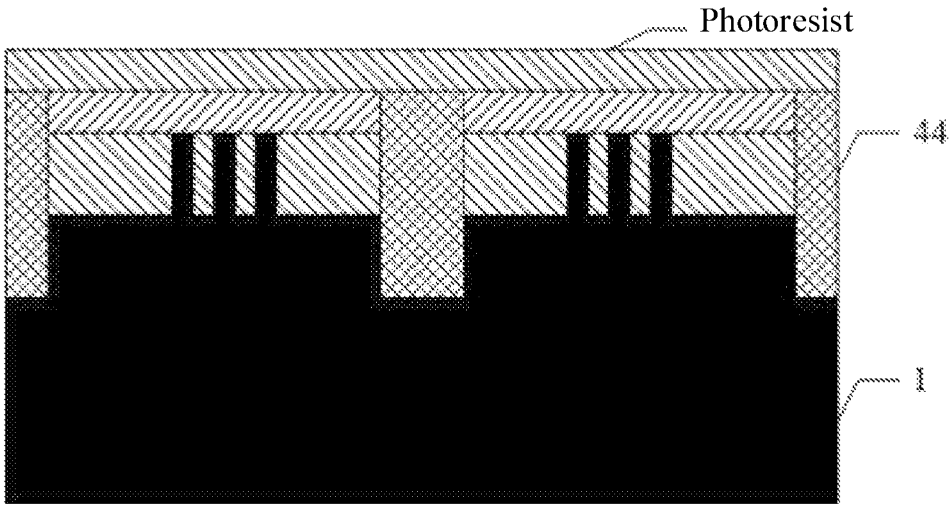
FIG. 12 shows a cross-sectional view taken along line B-B in FIG. 10 after etching a first filler and a silicon substrate.

FIG. 10 shows a top view after etching the first filler and the silicon substrate according to embodiments of the present disclosure (the photoresist is not yet removed). FIG. 11 shows a cross-sectional view taken along line A-A in FIG. 10 after etching a first filler and the silicon substrate. FIG. 12 shows a cross-sectional view taken along line B-B in FIG. 10 after etching the first filler and the silicon substrate. As shown in the drawings, the preset range is perpendicular to the fin 11 (i.e., the "preset range" in FIG. 10 refers to a solid long strip region). After the photoresist within the preset range is exposed and removed, a portion of the first filler 44 in the first trench 41 and a portion of the first filler 44 in the second trench 42 are exposed, and a range profile of the exposed first filler 44 (i.e., the position where the first initial blind hole 5 is subsequently formed) is the second preset pattern. According to the second preset pattern, the first filler 44 is selectively etched from the top surface of the first filler 44 downwardly by using the sacrificial layer 3 and the photoresist as a barrier layer, so as to expose the silicon substrate 1. Then, the silicon substrate 1 with the second preset depth is selectively etched by using the first filler 44 and the sacrificial layer 3 as a barrier layer (it should be noted that the silicon substrate 1 may not be penetrated), and an etched cavity is the first initial blind hole 5.

In the above-mentioned method, after the top surface of the first filler 44 and the top surface of the sacrificial layer 3 are coated with the photoresist, the photoresist in the preset range is exposed and removed in a direction perpendicular to the fin 11 (i.e., perpendicular to the direction of the first filler 44), and the preset range and the first filler 44 form an "intersection" so as to determine the position of the first initial blind hole 5 (i.e., the position of a nanometer through-silicon-via). Compared to directly exposing the pattern at the position of the first blind hole 5 on the photoresist, the above-mentioned method may improve position accuracy and avoid a potential lithography alignment problem between the buried power rail and the nanometer through-silicon-via, which is conducive to a further miniaturization of metal oxide semiconductor FET devices. By changing the second preset depth, a depth of the first initial blind hole 5 may be adjusted, thereby effectively controlling a depth of the nanometer through-silicon-via.

In step S5, a second filler 45 is filled in the first initial blind hole 5 until the second filler 45 is flush with the top surface of the sacrificial layer 3. The sacrificial layer 3, and the first filler 44 and second filler 45 located within a height range of the sacrificial layer 3 are sequentially removed to obtain a second structure. The second filler 45 includes $SiO_2$.

Figure 13:
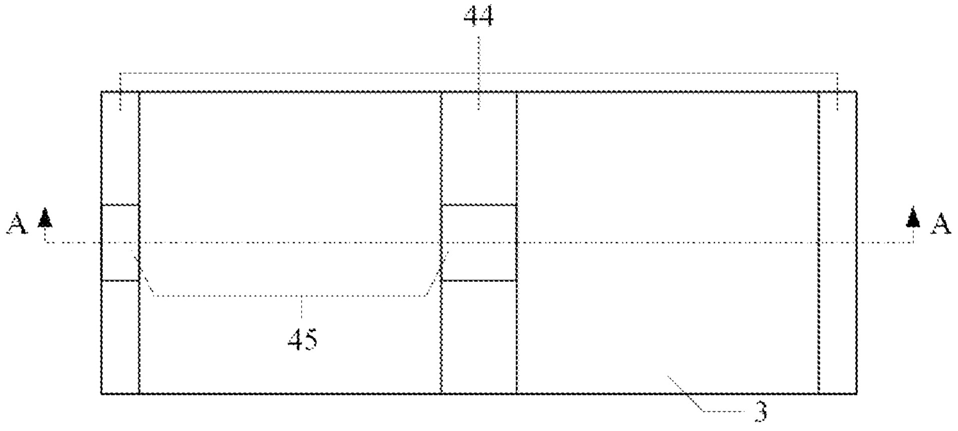
FIG. 13 shows a top view after filling a second filler in a first initial blind hole according to embodiments of the present disclosure.
Figure 14:
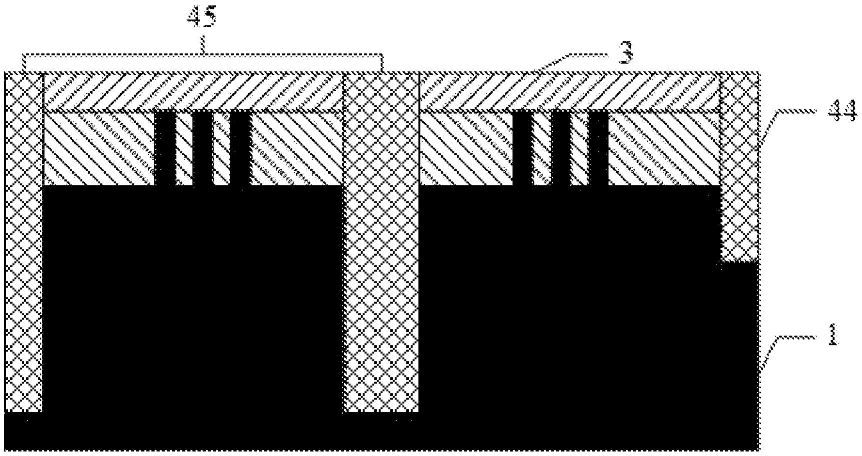
FIG. 14 shows a cross-sectional view taken along line A-A in FIG. 13 after filling a second filler in a first initial blind hole.
Figure 15:
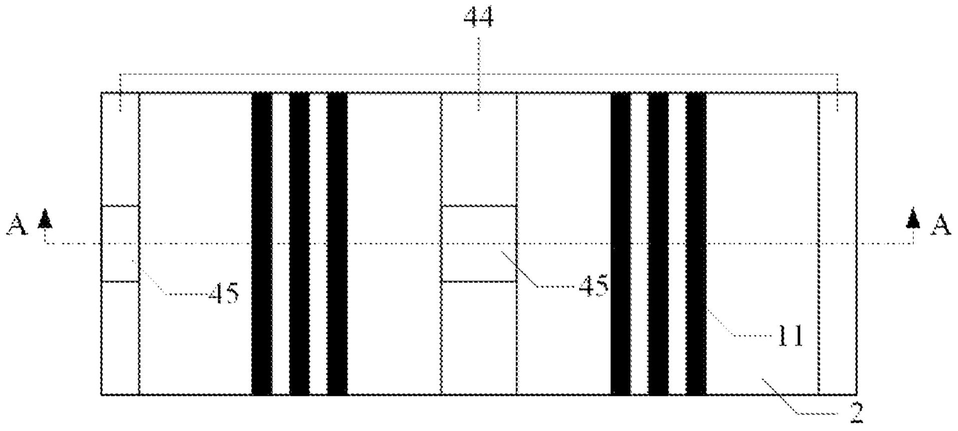
FIG. 15 shows a top view of a second structure according to embodiments of the present disclosure.
Figure 16:
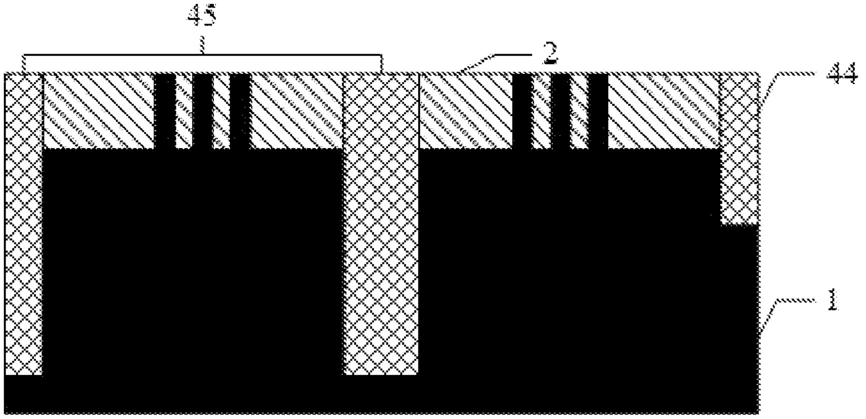
FIG. 16 shows a cross-sectional view of a second structure taken along line A-A in FIG. 15.

FIG. 13 shows a top view after filling the second filler in the first initial blind hole according to embodiments of the present disclosure. FIG. 14 shows a cross-sectional view taken along line A-A in FIG. 13 after filling the second filler in the first initial blind hole. FIG. 15 shows a top view of the second structure according to embodiments of the present disclosure. FIG. 16 shows a cross-sectional view of the second structure taken along line A-A in FIG. 15. In some embodiments of the present disclosure, "the second filler 45 is filled in the first initial blind hole 5 until the top surface of the second filler 45 is flush with the sacrificial layer 3" includes: after the filling is completed, planarization is performed by means of CMP, so that the second filler 45 is flush with the top surface of the sacrificial layer 3. It should be understood that: in the above-mentioned operations, planarization is performed through CMP by using the sacrificial layer 3 as a stop layer, which is only a schematic example and is not intended to limit the present disclosure.

In embodiments of the present disclosure, a material of the sacrificial layer 3 has an anisotropic etching selective ratio smaller or equal to a predetermined ratio with respect to the silicon substrate 1, the first $SiO_2$ layer 2, the first filler 44 and the second filler (45), and the predetermined ratio is 1:10. For example, the sacrificial layer 3 uses silicon nitride or other nitrogen doped silicon oxide, and a growth method of the sacrificial layer 3 includes but is not limited to deposition.

In step S6, a second $SiO_2$ layer 6 is grown on a top surface of the second structure, the second $SiO_2$ layer 6 corresponding to a position of the remaining first filler 44 and the second $SiO_2$ layer 6 corresponding to a position of the remaining second filler 45 are etched. The remaining first filler 44 is etched to form a target trench 4', and the remaining second filler 45 is etched to form a first target blind hole 51.

Figure 17:
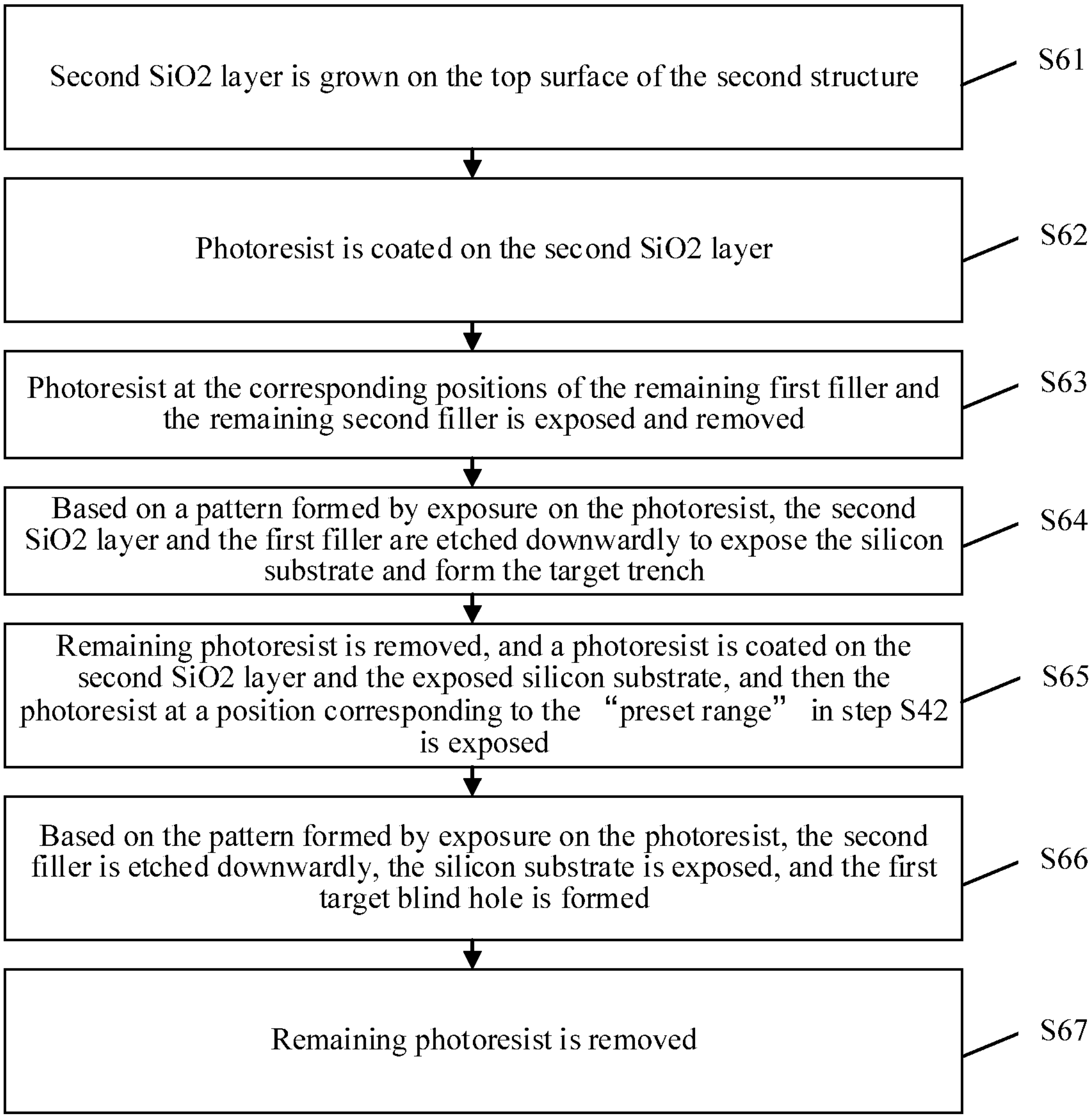
FIG. 17 shows a flowchart of forming a target trench and a first target blind hole from a second structure according to embodiments of the present disclosure.

FIG. 17 shows a flowchart of forming the target trench and the first target blind hole from the second structure according to embodiments of the present disclosure. As shown in FIG. 17, in some embodiments of the present disclosure, the above-mentioned step S6 includes the following steps.

In step S61, the second $SiO_2$ layer 6 is grown on the top surface of the second structure.

In step S62, a photoresist is coated on the second $SiO_2$ layer 6.

In step S63, the photoresist at the corresponding positions of the remaining first filler 44 and the remaining second filler 45 is exposed and removed.

In step S64, based on a pattern formed by exposure on the photoresist, the second $SiO_2$ layer 6 and the first filler 44 are etched downwardly to expose the silicon substrate 1 and form the target trench 4'.

In step S65, the remaining photoresist is removed, and a photoresist is coated on the second $SiO_2$ layer 6 and the exposed silicon substrate 1, and then the photoresist at a position corresponding to the "preset range" in step S42 is exposed.

In step S66, based on the pattern formed by exposure on the photoresist, the second filler 45 is etched downwardly, the silicon substrate 1 is exposed, and the first target blind hole 51 is formed.

In step S67, the remaining photoresist is removed.

Figure 18:
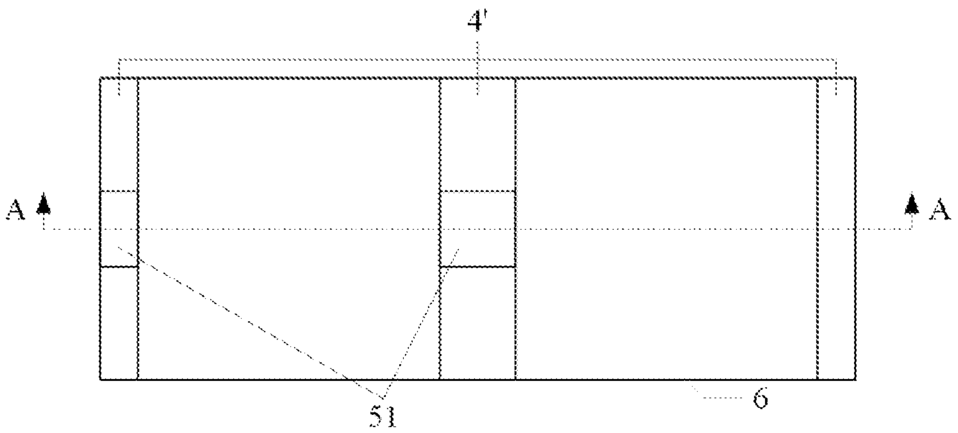
FIG. 18 shows a top view of forming a target trench and a first target blind hole in a second structure according to embodiments of the present disclosure.
Figure 19:
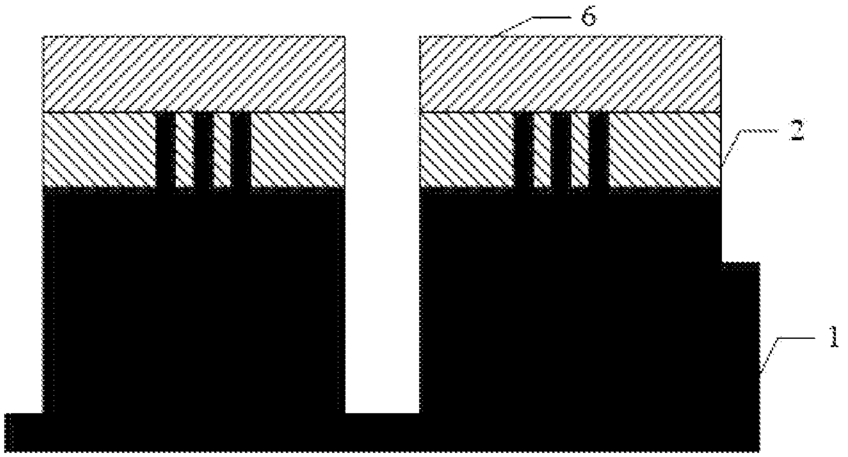
FIG. 19 shows a cross-sectional view taken along line A-A in FIG. 18 of forming a target trench and a first target blind hole in a second structure.

FIG. 18 shows a top view of forming the target trench and the first target blind hole in the second structure according to embodiments of the present disclosure. FIG. 19 shows a cross-sectional view taken along line A-A in FIG. 18 of forming the target trench and the first target blind hole in the second structure.

In some embodiments of the present disclosure, a sequence of the operation of forming the target trench 4' and the operation of forming the first target blind hole 51 described above may be selected. Due to an existence of the etching selective ratio, an etching speed of an etched object is greater than an etching speed of another object during etching (for example, when etching the first filler, an etching speed of the second filler is much lower than an etching speed of the first filler). That is, the target trench 4' may be first etched and formed, and then the first target blind hole 51 may be etched and formed; or the first target blind hole 51 may be first etched and formed, and then the target trench 4' may be etched and formed.

In some embodiments of the present disclosure, both the first filler 44 and the second filler 45 are $SiO_2$, and the target trench 4' and the first target blind hole 51 may be formed by etching at one time, and the above-mentioned step S63 to step S66 may be adjusted as: the photoresist at the corresponding positions of the remaining first filler 44 and the remaining second filler 45 is exposed and removed; according to the pattern formed by exposure on the photoresist, the second $SiO_2$ layer 6 may be etched downwardly, the remaining first filler 44 and the remaining second filler 45 are etched and removed, the silicon substrate 1 at the corresponding position of the remaining second filler 45 is exposed; so that the target trench 4' and the first target blind hole 51 are formed. Based on this, after the silicon substrate 1 at the corresponding position of the "remaining first filler 44" described above is exposed, "the remaining second filler 45" described above still remains. During a subsequent etching process until the silicon substrate 1 at the corresponding position of "the remaining second filler 45" is exposed, the silicon substrate 1 at the corresponding position of "the remaining first filler 44" that has been exposed will be slightly etched and undergo a depth change, However, due to the existence of the etching selective ratio, the depth change may be ignored and may be quantitatively calculated based on the etching selective ratio.

In some embodiments of the present disclosure, the above-mentioned step S6 further includes: after forming the target trench 4', continuously etching the silicon substrate 1 with a third preset depth downwardly (the etched silicon substrate should be higher than a bottom surface of the first target blind hole 51), and/or after forming the first target blind hole 51, continuously etching the silicon substrate 1 with a fourth preset depth downwardly (the silicon substrate 1 should not be penetrated after etching), so as to adjust a depth of the target trench 4' and/or adjust a depth of the first target blind hole 51, thereby adjusting the depth of the final buried power rail and/or adjusting the depth of the final nanometer through-silicon-via.

In some embodiments of the present disclosure, the above-mentioned step S61 of growing the second $SiO_2$ layer 6 on the top surface of the second structure is performed by continuously using a standard FinFET process on the basis of the second structure until a "front end process" of the FinFET process is completed, and the FinFET process is suspended, so that a structure of the second $SiO_2$ layer 6 growing on the top surface of the second structure is obtained.

In step S7, a third filler 46 is filled in the target trench 4' and the first target blind hole 51; the third filler 46 is higher than a root of the fin 11 and lower than a top of the fin 11. A fourth filler 47 is filled on a top surface of the third filler 46 until the fourth filler 47 is flush with the second $SiO_2$ layer 6 so as to obtain a third structure. The third filler 46 includes tungsten, and the fourth filler 47 includes $SiO_2$.

Figure 20:
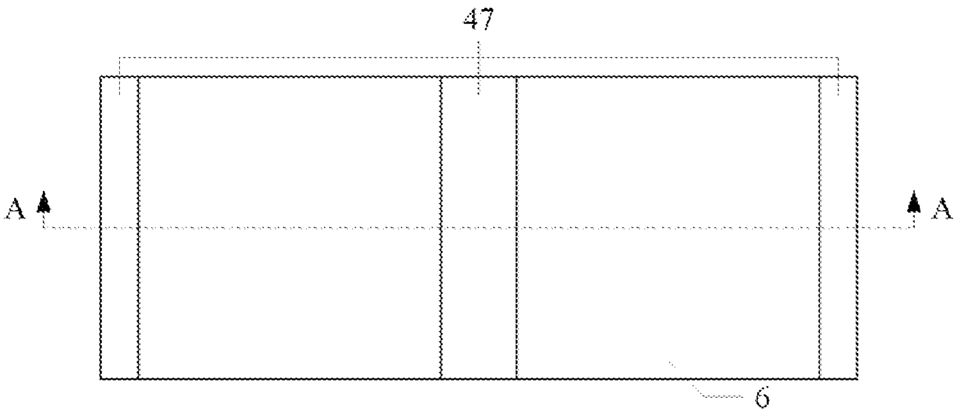
FIG. 20 shows a top view of a third structure according to embodiments of the present disclosure.
Figure 21:
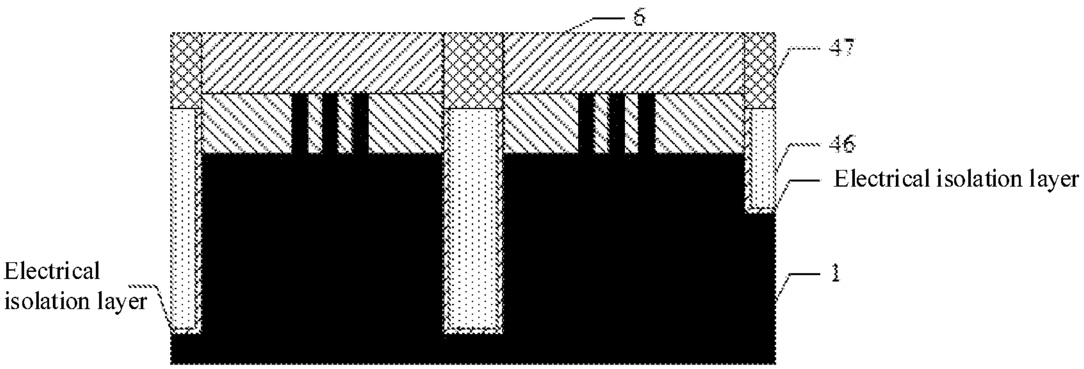
FIG. 21 shows a cross-sectional view of a third structure taken along line A-A in FIG. 20.

FIG. 20 shows a top view of the third structure according to embodiments of the present disclosure. FIG. 21 shows a cross-sectional view of the third structure taken along line A-A in FIG. 20.

In embodiments of the present disclosure, before filling the third filler 46 in the target trench 4' and the first target blind hole 51, the method further includes: forming an electrical isolation layer on a side of the target trench 4' and the cavity of the first target blind hole 51 by growing a pad oxide layer so as to achieve an electrical isolation between the buried power rail, the nanometer through-silicon-via, and the substrate, and sequentially growing a diffusion barrier layer and an adhesive layer on an inner side of the electrical isolation layer (i.e., the side of the target trench 4' and the cavity of the first target blind hole 51) through a standard contact formation process. In some embodiments of the present disclosure, the electrical isolation layer is a $SiO_2$ layer. It should be noted that in the accompanying drawings of the present disclosure, for ease of drawing, the electrical isolation layer, the diffusion barrier layer, and the adhesive layer are drawn together and marked with "electrical isolation layer". That is, the reference numeral "electrical isolation layer" in the accompanying drawings includes the electrical isolation layer, the diffusion barrier layer, and the adhesive layer.

In some embodiments of the present disclosure, "the fourth filler 47 is filled until the fourth filler 47 is flush with the second $SiO_2$ layer 6" includes: after the filling is completed, planarization is performed by using the second $SiO_2$ layer 6 as a stop layer by means of CMP, so that the fourth filler 47 is flush with the top surface of the second $SiO_2$ layer 6. It should be understood that planarization through CMP in the above-mentioned operation is only a schematic example and is not intended to limit the present disclosure. In the above-mentioned step S7, the third filler 46 being higher than the root of the fin 11 and lower than the top of the fin 11 is intended to form an effective middle interconnection.

In step S8, a third preset pattern is formed on a top surface of the third structure; according to the third preset pattern, the second $SiO_2$ layer 6, the fourth filler 47, and the first $SiO_2$ layer 2 are etched downwardly from the top surface of the third structure until the third filler 46 is exposed. A fifth filler 48 is filled in the trench generated by the etching until the fifth filler 48 is flush with the second $SiO_2$ layer 6 so as to obtain a fourth structure. The fifth filler 48 includes tungsten, and the third preset pattern does not include a position corresponding to the first target blind hole 51. In the fourth structure, the fifth filler 48 exists as a metal interconnection layer. In preferred embodiments of the present disclosure, there is a diffusion barrier layer and an adhesive layer between the fifth filler 48 and the $SiO_2$ layer. In some embodiments of the present disclosure, this step may be prepared through a standard FinFET middle interconnection process.

Figure 22:
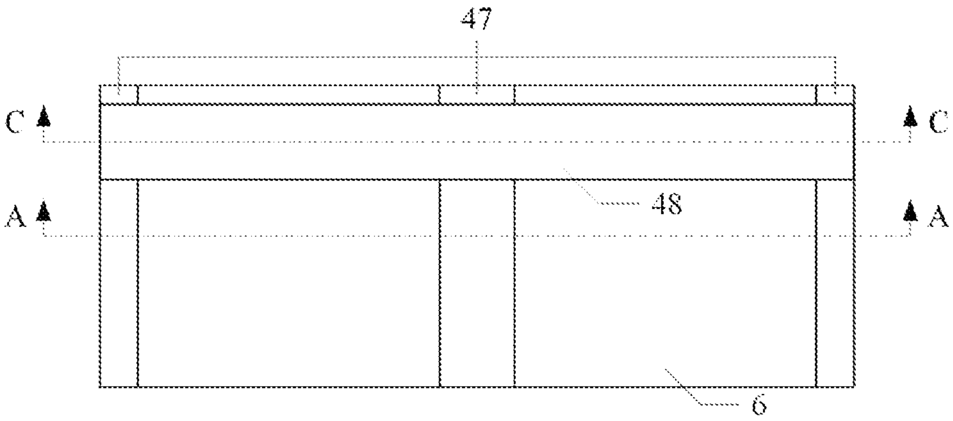
FIG. 22 shows a top view of a fourth structure according to embodiments of the present disclosure.
Figure 23:
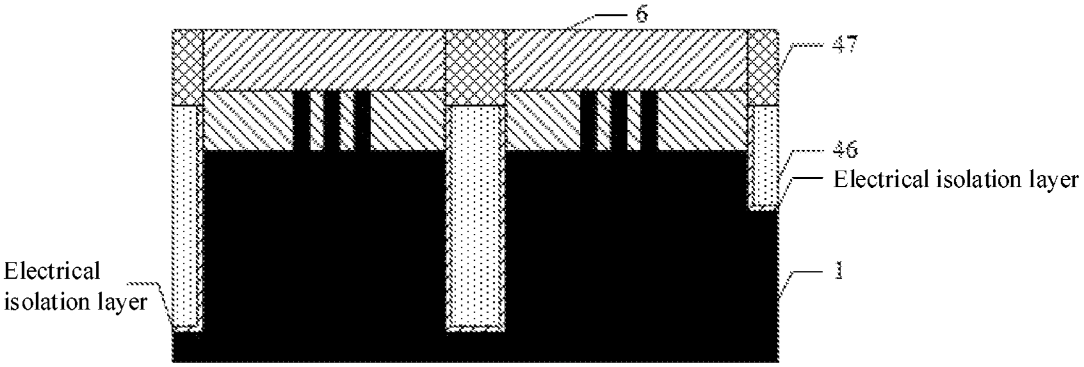
FIG. 23 shows a cross-sectional view of a fourth structure taken along line A-A in FIG. 22.
Figure 24:
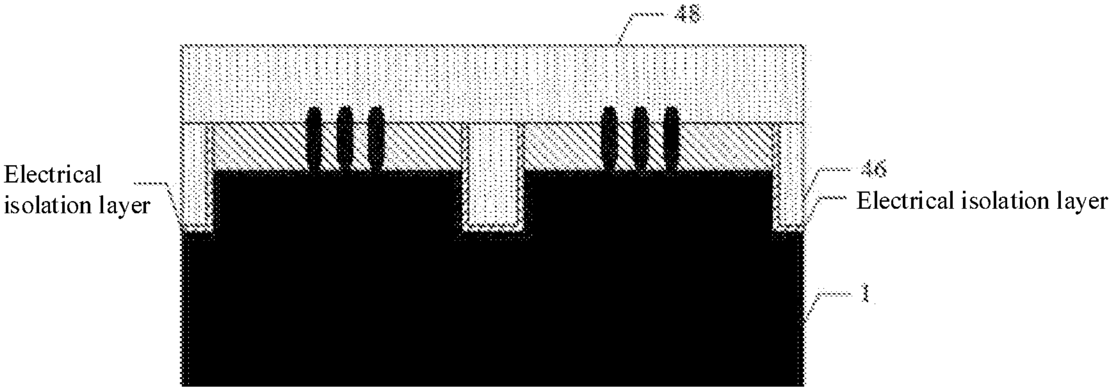
FIG. 24 shows a cross-sectional view of a fourth structure taken along line C-C in FIG. 22.

FIG. 22 shows a top view of the fourth structure according to embodiments of the present disclosure. FIG. 23 shows a cross-sectional view of the fourth structure taken along line A-A in FIG. 22. FIG. 24 shows a cross-sectional view of the fourth structure taken along line C-C in FIG. 22. It should be noted that in FIG. 24, A fin structure at C-C line cut position has undergone changes in the previous "front end process" of the FinFET process which is schematically illustrated in FIG. 24. The change belongs to the standard FinFET process and will not be repeated here. In some embodiments of the present disclosure, "the fifth filler 48 is filled until the fifth filler 48 is flush with the second $SiO_2$ layer 6" includes: after the filling is completed, planarization is performed by using the second $SiO_2$ layer 6 as a stop layer by means of CMP, so that the fifth filler 48 is flush with the top surface of the second $SiO_2$ layer 6. It should be understood that planarization through CMP in the above-mentioned operation is only a schematic example and is not intended to limit the present disclosure.

In some embodiments of the present disclosure, the second $SiO_2$ layer 6, the fourth filler 47, and the first $SiO_2$ layer 2 are all $SiO_2$. Therefore, the etching operation in step S8 described above is: according to the third preset pattern, etching $SiO_2$ downwardly from the top surface of the third structure until the third filler 46 is exposed.

In step S9, the fourth structure is thinned from a side of the silicon substrate 1 until the third filler 46 in the first target blind hole 5' is exposed, so that a self-aligned nanometer through-silicon-via structure is obtained.

Figure 25:
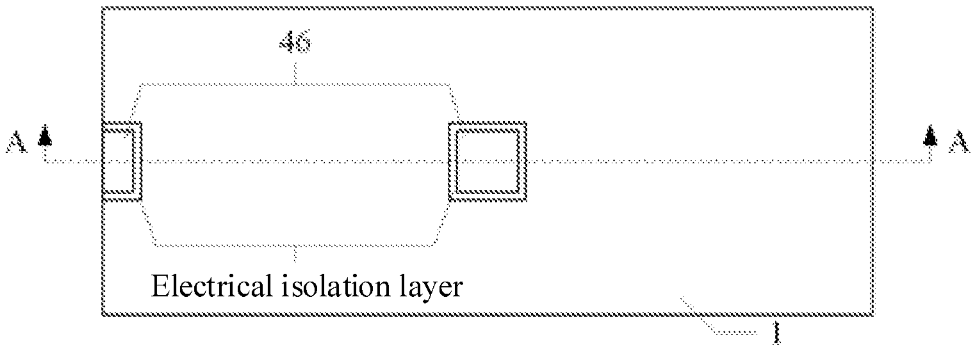
FIG. 25 shows a bottom view of a self-aligned nanometer through-silicon-via structure according to embodiments of the present disclosure.
Figure 26:
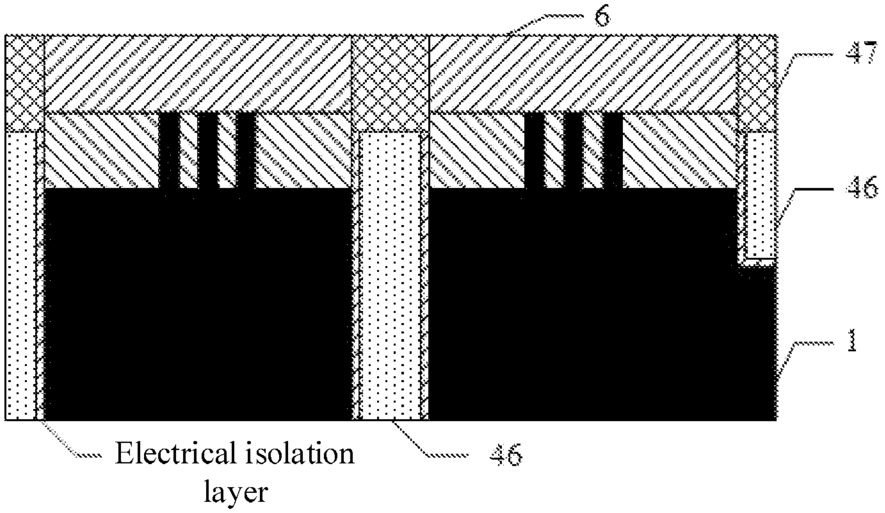
FIG. 26 shows a cross-sectional view taken along line A-A in FIG. 25 of a self-aligned nanometer through-silicon-via structure.

FIG. 25 shows a bottom view of the self-aligned nanometer through-silicon-via structure according to embodiments of the present disclosure. FIG. 26 shows a cross-sectional view taken along line A-A in FIG. 25 of the self-aligned nanometer through-silicon-via structure. The electrical isolation layer is drawn in the drawings.

In some embodiments of the present disclosure, in step S9 described above, after thinning to expose the third filler 46 in the first target blind hole 51, further thinning may be carried out as needed to adjust the depth of the nanometer through-silicon-via.

In some embodiments of the present disclosure, the thinning operation may be achieved through CMP. In order to shorten a preparation cycle, other methods with lower precision may be used for preliminary thinning, and when a target thinning amount is about to be achieved, the CMP may be used for refined thinning.

In some embodiments of the present disclosure, before step S9, the method further includes: the standard FinFET process is continuously performed on the fourth structure until a "back-end process" of the FinFET process is completed, the FinFET process is suspended, and then the fourth structure is thinned from a side of the silicon substrate 1.

Figure 27:
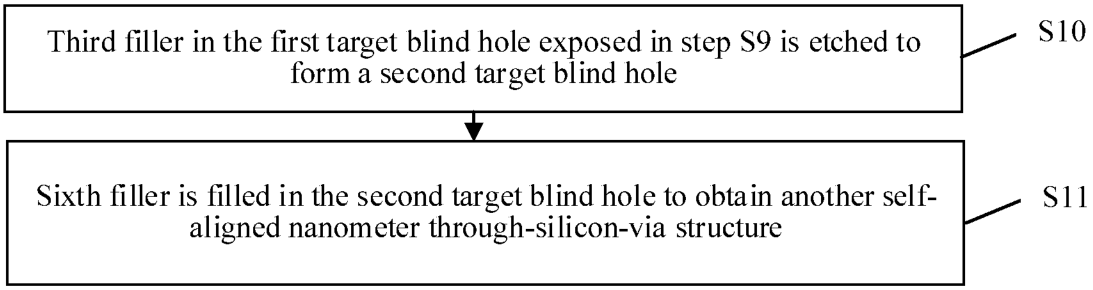
FIG. 27 shows a flowchart of a method of preparing another self-aligned nanometer through-silicon-via structure according to embodiments of the present disclosure.

FIG. 27 shows a flowchart of a method of preparing another self-aligned nanometer through-silicon-via structure according to embodiments of the present disclosure. As shown in FIG. 27, in another embodiment of the present disclosure, the method is based on the self-aligned nanometer through-silicon-via structure prepared in step S9 described above, and the method includes step S10 to step S11.

In step S10, the third filler 46 in the first target blind hole 51 exposed in step S9 is etched to form a second target blind hole 52, and the second target blind hole 52 does not exceed a plane where the root of the fin 11 is located.

In step S11, a sixth filler 49 is filled in the second target blind hole 52 to obtain another self-aligned nanometer through-silicon-via structure. A conductivity of the sixth filler 49 is better than a conductivity of the third filler 46. In some embodiments of the present disclosure, the sixth filler 46 is made of copper.

A bottom view of another self-aligned nanometer through-silicon-via structure prepared according to embodiments of the present disclosure is roughly the same as the bottom view of the self-aligned nanometer through-silicon-via structure obtained in step S9, except that a partial depth third filler 46 is replaced by the sixth filler 49.

Figure 28:
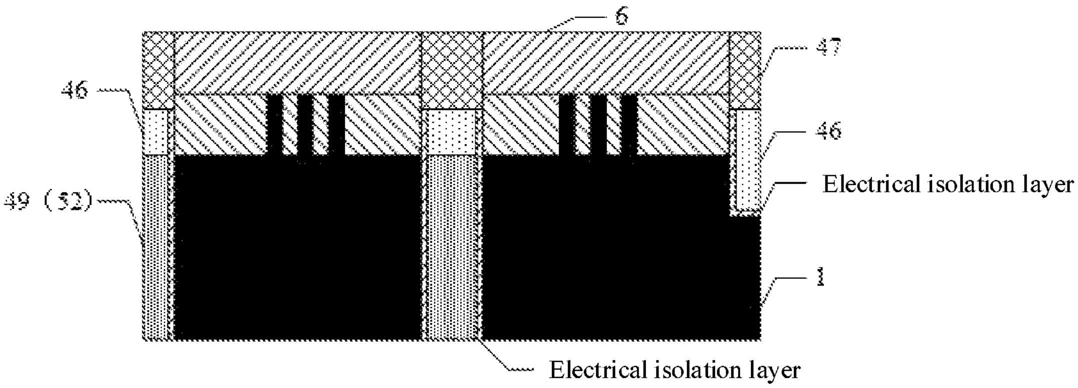
FIG. 28 shows a cross-sectional view of another self-aligned nanometer through-silicon-via structure according to embodiments of the present disclosure.
Figure 29:
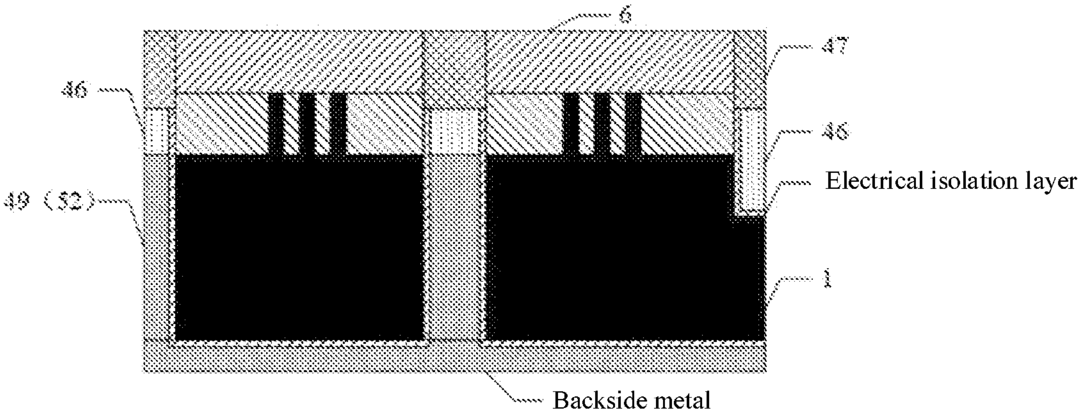
FIG. 29 shows a schematic diagram of a structure after forming a backside power delivery network based on the self-aligned nanometer through-silicon-via structure shown in FIG. 28.

FIG. 28 shows a cross-sectional view of another self-aligned nanometer through-silicon-via structure according to embodiments of the present disclosure. FIG. 29 shows a schematic diagram of a structure after forming a backside power delivery network based on the self-aligned nanometer through-silicon-via structure shown in FIG. 28. In FIG. 28 and FIG. 29, the backside metal (BSM) and the sixth filler 49 are both copper. A contact portion between the backside metal and the silicon substrate 1 also includes an electrical isolation layer, a diffusion barrier layer, and an adhesive layer, and the electrical isolation layer is located on a side of the silicon substrate 1.

According to embodiments of the present disclosure, the etched third filler 46 is replaced with copper with a better conductivity, this may reduce an interface contact resistance between the buried power rail and the nanometer through-silicon-via, which is conducive to a widespread application of backside power delivery network technology.

Figure 30:
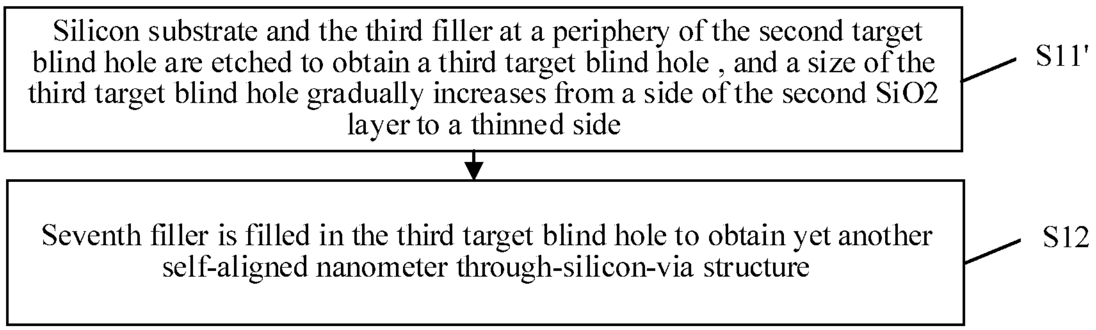
FIG. 30 shows a flowchart of a method of preparing yet another self-aligned nanometer through-silicon-via structure according to embodiments of the present disclosure.

FIG. 30 shows a flowchart of a method of preparing yet another self-aligned nanometer through-silicon-via structure according to embodiments of the present disclosure. As shown in FIG. 30, in yet another embodiment of the present disclosure, the method is based on the structure obtained from the above-mentioned step S10, and the method includes step S11' to step S12'.

In step S11', the silicon substrate 1 and the third filler 46 at a periphery of the second target blind hole 52 are etched to obtain a third target blind hole 53, and a size of the third target blind hole 53 gradually increases from a side of the second $SiO_2$ layer 6 to a thinned side.

In step S12', a seventh filler 40 is filled in the third target blind hole 53 to obtain yet another self-aligned nanometer through-silicon-via structure, the seventh filler 40 includes copper or tungsten.

According to embodiments of the present disclosure, before etching the silicon substrate 1 and the third filler 46 at the periphery of the second target blind hole 52 in step S11', the method further includes: sequentially removing the adhesive layer, the diffusion barrier layer, and the electrical isolation layer on a side wall of the second target blind hole 52. In embodiments of the present disclosure, before filling the seventh filler 40 in the third target blind hole in step S12', the method further includes: sequentially growing an electric isolation layer, a diffusion barrier layer, and an adhesive layer on a side wall of the third target blind hole 53. In some embodiments of the present disclosure, the electrical isolation layer is a $SiO_2$ layer. A specific method for growing the electrical isolation layer, the diffusion barrier layer, and the adhesive layer has been described in detail above and will not be repeated.

According to embodiments of the present disclosure, the etching in the above-mentioned method of preparing the self-aligned nanometer through-silicon-via structure includes reactive ion etching or high-density plasma etching.

Figure 31:
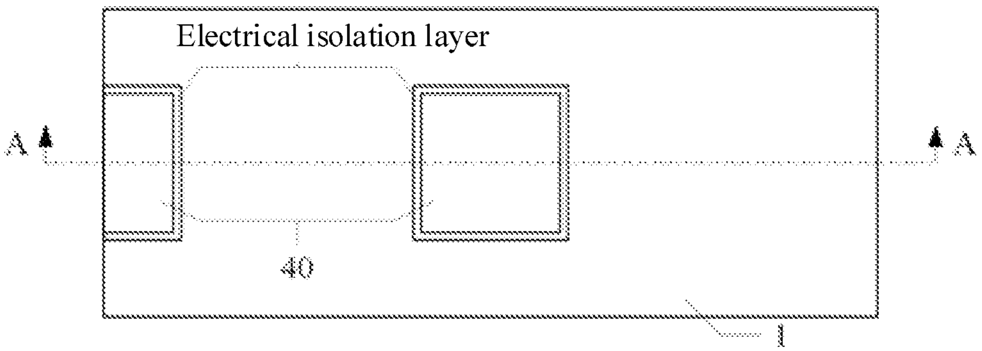
FIG. 31 shows a bottom view of yet another self-aligned nanometer through-silicon-via structure according to embodiments of the present disclosure.
Figure 32:
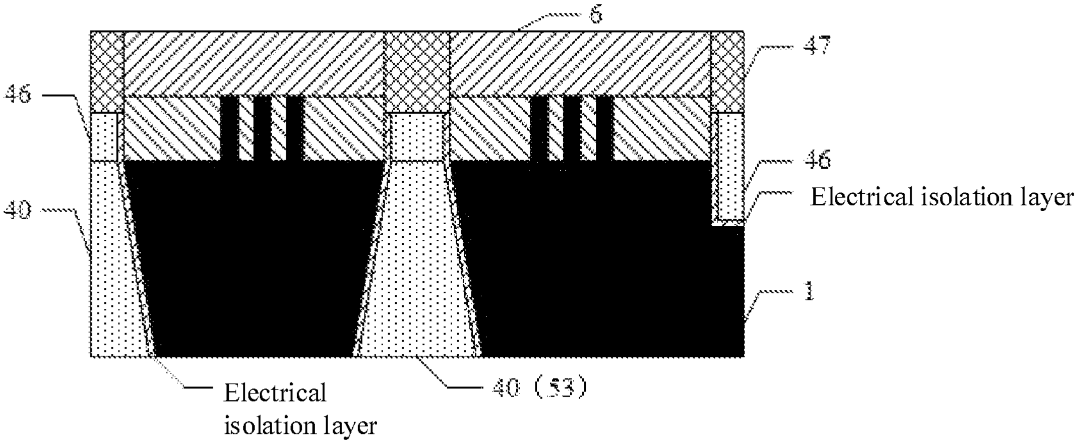
FIG. 32 shows a cross-sectional view taken along line A-A in FIG. 31 of yet another self-aligned nanometer through-silicon-via structure.
Figure 33:
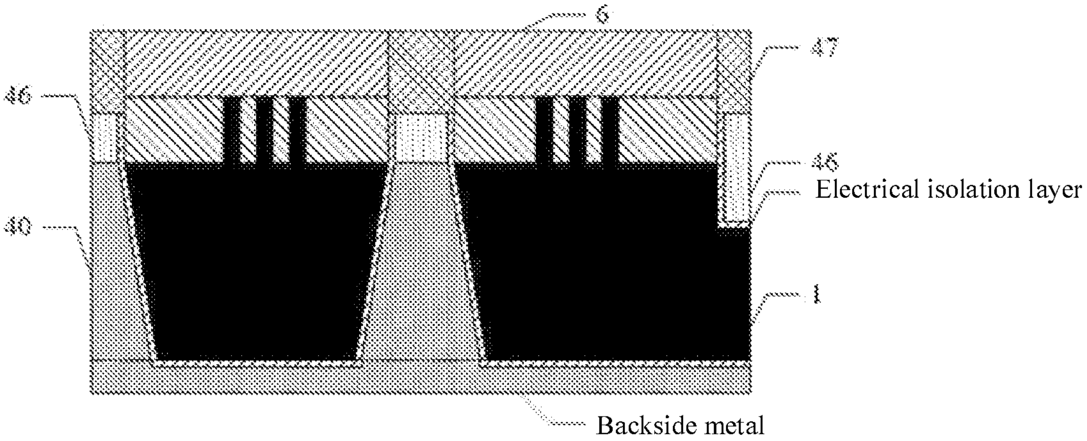
FIG. 33 shows a schematic diagram of a structure after forming a backside power delivery network based on the self-aligned nanometer through-silicon-via structure shown in FIG. 32.

FIG. 31 shows a bottom view of yet another self-aligned nanometer through-silicon-via structure according to embodiments of the present disclosure. FIG. 32 shows a cross-sectional view taken along line A-A in FIG. 31 of yet another self-aligned nanometer through-silicon-via structure. FIG. 33 shows a schematic diagram of a structure after forming a backside power delivery network based on the self-aligned nanometer through-silicon-via structure shown in FIG. 32.

In the above-mentioned step S11', the third target blind hole 53 is obtained by etching the silicon substrate 1 and the third filler 46 at the periphery of the second target blind hole 52, where the size of the third target blind hole 53 gradually increases from a side of the second $SiO_2$ layer 6 to the thinned side (a position of the seventh filler 40 in FIG. 32 is a position of the third target blind hole 53, and the third filler 46 and seventh filler 40 in the drawings are both tungsten). The third target blind hole 53 that is larger in size than the second target blind hole 52 is obtained, so that a size of the final formed nanometer through-silicon-via is enlarged. Based on this, the interface contact resistance between the buried power rail and the nanometer through-silicon-via in the self-aligned nanometer through-silicon-via structure may be reduced, which is conducive to the widespread application of backside power delivery network technology. FIG. 33 shows the structure after the backside power delivery network is formed based on the self-aligned nanometer through-silicon-via structure. The third filler 46 in FIG. 33 is tungsten, and the seventh filler 40 and the backside metal are both made of copper with a better conductivity, which may further reduce the interface contact resistance between the buried power rail and the nanometer through-silicon-via, and is conducive to the widespread application of backside power delivery network technology.

By configuring backside metal on the thinned side of the self-aligned nanometer through-silicon-via structure formed in the above-mentioned step S12, a backside power delivery network may be formed through interconnection. The backside metal is generally copper with excellent conductivity.

Embodiments of the present disclosure further provide a self-aligned nanometer through-silicon-via structure, and the self-aligned nanometer through-silicon-via structure is prepared by the method described above. According to embodiments of the present disclosure, the self-aligned nanometer through-silicon-via structure may be applied to various electronic apparatuses. The electronic apparatuses may include, for example, a smart phone, a personal computer (PC), a tablet computer, a wearable apparatus, an artificial intelligence apparatus, a portable power source, and so on.

In the above-mentioned descriptions, technical details such as patterning and etching of each layer have not been described in detail. However, those skilled in the art should understand that various technical means may be used to form layers, regions, etc. of desired shapes. In addition, in order to form the same structure, those skilled in the art may further design a method that is not completely the same as the method described above. In addition, although the various embodiments are described above separately, this does not mean that the measures in the various embodiments may not be advantageously used in combination.

The specific embodiments described above further explain objectives, technical solutions and beneficial effects of the present disclosure in detail. It should be understood that the specific embodiments described above are only specific embodiments of the present disclosure, and should not be used to limit the present disclosure. Any modifications, equivalent substitutions, improvements and the like made within the spirit and principle of the present disclosure should be included in the protection scope of the present disclosure.

What is claimed is:

1. A method of preparing a self-aligned nanometer through-silicon-via structure, comprising:

step S1, providing a silicon substrate, wherein the silicon substrate comprises a fin structure perpendicular to a surface of the silicon substrate and extending upwardly, growing a first $SiO_2$ layer on the silicon substrate, wherein the first $SiO_2$ layer covers the fin and is located at a same height as the fin, so that a first structure is obtained;

step S2, growing a sacrificial layer on a top surface of the first structure, forming a first preset pattern on a top surface of the sacrificial layer, sequentially etching the sacrificial layer, the first $SiO_2$ layer, and the silicon substrate with a first preset depth downwardly from the top surface of the sacrificial layer according to the first preset pattern so as to form an initial trench parallel to the fin, wherein the initial trench comprises a first trench, a second trench, and a third trench arranged in sequence;

step S3, filling a first filler in the initial trench until the first filler is flush with the top surface of the sacrificial layer, wherein the first filler comprises $SiO_2$;

step S4, forming a second preset pattern on a top surface of the first filler, wherein the second preset pattern is located at positions of the first trench and the second trench, sequentially etching the first filler and the silicon substrate with a second preset depth downwardly from the top surface of the first filler according to the second preset pattern so as to form a first initial blind hole;

step S5, filling a second filler in the first initial blind hole until the second filler is flush with the top surface of the sacrificial layer, removing the sacrificial layer, and the first filler and second filler located within a height range of the sacrificial layer sequentially so as to obtain a second structure, wherein the second filler comprises $SiO_2$;

step S6, growing a second $SiO_2$ layer on a top surface of the second structure, etching the second $SiO_2$ layer corresponding to a position of the remaining first filler and the second $SiO_2$ layer corresponding to a position of the remaining second filler, etching the remaining first filler to form a target trench, and etching the remaining second filler to form a first target blind hole;

step S7, filling a third filler in the target trench and the first target blind hole, wherein the third filler is higher than a root of the fin and lower than a top of the fin, filling a fourth filler on a top surface of the third filler until the fourth filler is flush with the second $SiO_2$ layer so as to obtain a third structure, wherein the third filler comprises tungsten and the fourth filler comprises $SiO_2$;

step S8, forming a third preset pattern on a top surface of the third structure, etching the second $SiO_2$ layer, the fourth filler, and the first $SiO_2$ layer downwardly from the top surface of the third structure according to the third preset pattern until the third filler is exposed, filling a fifth filler in a trench generated by etching until the fifth filler is flush with the second $SiO_2$ layer, so that a fourth structure is obtained, wherein the fifth filler comprises tungsten, and the third preset pattern does not comprise a position corresponding to the first target blind hole; and step S9, thinning the fourth structure from a side of the silicon substrate until the third filler in the first target blind hole is exposed, so that a self-aligned nanometer through-silicon-via structure is obtained, wherein an anisotropic etching selective ratio of a material used in the sacrificial layer to the silicon substrate, the first $SiO_2$ layer, the first filler, and the second filler are less than or equal to a preset ratio, and the preset ratio is 1:10;

wherein before filling the third filler in the target trench and the first target blind hole in step S7, the method further comprises:

sequentially growing an electrical isolation layer, a diffusion barrier layer, and an adhesive layer at a bottom and a side wall of the target trench and the first target blind hole.

2. The method according to claim 1, wherein after step S9, the method further comprises:

step S10, etching the third filler in the first target blind hole exposed in step S9 so as to form a second target blind hole, wherein the second target blind hole does not exceed a plane where the root of the fin is located; and step S11, filling a sixth filler in the second target blind hole to obtain another self-aligned nanometer through-silicon-via structure, wherein the sixth filler comprises copper.

3. The method according to claim 2, wherein after step S10, the method further comprises:

step S11', etching the silicon substrate and the third filler at a periphery of the second target blind hole so as to obtain a third target blind hole, wherein a size of the third target blind hole gradually increases from a side of the second $SiO_2$ layer to a thinned side; and step S12', filling a seventh filler in the third target blind hole to obtain yet another self-align nanometer through-silicon-via structure, wherein the seventh filler comprises copper or tungsten.

4. The method according to claim 3, wherein before etching the silicon substrate at the periphery of the second target blind hole in step S11', the method further comprises:

sequentially removing the adhesive layer, the diffusion barrier layer, and the electrical isolation layer on a side wall of the second target blind hole.

5. The method according to claim 3, wherein before filling the seventh filler in the third target blind hole in step S12', the method further comprises:

sequentially growing an electrical isolation layer, a diffusion barrier layer, and an adhesive layer on a side wall of the third target blind hole.

6. The method according to claim 1, wherein the first structure is obtained by:

performing a fin field-effect transistor process until an inter fin isolation oxide filling step of the fin field-effect transistor process is completed, so that the first structure is obtained.

7. The method according to claim 1, wherein the step S2 comprises:

coating a photoresist on an upper surface of the sacrificial layer, forming the first preset pattern through exposure, wherein the first preset pattern is parallel to a direction of the fin and is not located above the fin; and sequentially etching the sacrificial layer, the first $SiO_2$ layer, and the silicon substrate downwardly from the top surface of the sacrificial layer according to the first preset pattern, and removing the remaining photoresist so as to obtain the initial trench, wherein the operation of removing the remaining photoresist is performed after the operation of etching the sacrificial layer, or performed after sequentially etching the sacrificial layer, the first $SiO_2$ layer, and the silicon substrate downwardly from the top surface of the sacrificial layer.

8. The method according to claim 1, wherein in step S4, the operation of "forming a second preset pattern on a top surface of the first filler, wherein the second preset pattern is located at positions of the first trench and the second trench, sequentially etching the first filler and the silicon substrate with a second preset depth downwardly from the top surface of the first filler according to the second preset pattern so as to form a first initial blind hole" comprises:

coating a photoresist on the top surface of the first filler and the top surface of the sacrificial layer;

exposing the photoresist within a preset range in a direction perpendicular to the fin, and determining a position corresponding to the exposed first filler as the second preset pattern; and sequentially etching the first filler and the silicon substrate with the second preset depth downwardly from the top surface of the first filler according to the second preset pattern, and removing the remaining photoresist so as to form the first initial blind hole, wherein the operation of removing the remaining photoresist is performed after the operation of etching the first filler, or performed after sequentially etching the first filler and the silicon substrate with the second preset depth downwardly from the top surface of the first filler.

9. The method according to claim 1, wherein the step S6 further comprises:

after forming the target trench, continuously etching the silicon substrate with a third preset depth downwardly, and/or after forming the first target blind hole, continuously etching the silicon substrate with a fourth preset depth downwardly.

10. A self-aligned nanometer through-silicon-via structure, wherein the self-aligned nanometer through-silicon-via structure is prepared by the method of claim 1.

* * * * *